United States Patent [19]

Tetlie et al.

[11] Patent Number: 4,841,192

[45] Date of Patent: Jun. 20, 1989

[54] PIEZOELECTRIC HYDROPHONE

[75] Inventors: Per J. Tetlie, Horten; Hans N. Brudal, Tonsberg; Alf E. Meisingset, Horten, all of Norway

[73] Assignee: Getech A/S, Horten, Norway

[21] Appl. No.: 100,833

[22] Filed: Sep. 25, 1987

[30] Foreign Application Priority Data

Sep. 26, 1986 [NO] Norway ........ 863841

[51] Int. Cl.[4] ........ H01L 41/08

[52] U.S. Cl. ........ 310/337; 310/331; 310/332; 367/157

[58] Field of Search ........ 310/330-332, 310/337; 367/140, 141, 155, 157-163, 165, 167, 173, 174, 176, 180, 188

[56] References Cited

U.S. PATENT DOCUMENTS

| | | | |
|---|---|---|---|
| 3,202,962 | 8/1965 | Elston | 310/337 X |
| 3,255,431 | 6/1966 | Howatt | 310/337 X |
| 3,832,762 | 9/1974 | Johnston et al. | 310/337 X |
| 3,970,878 | 7/1976 | Berglund | 310/337 |
| 4,163,206 | 7/1979 | Hall, Jr. | 310/337 X |
| 4,336,639 | 6/1982 | Bergland | 310/337 X |
| 4,536,862 | 8/1985 | Sullivan et al. | 310/337 X |
| 4,679,178 | 7/1987 | Larson et al. | 310/337 X |

*Primary Examiner*—Mark O. Budd

*Attorney, Agent, or Firm*—Fleit, Jacobson, Cohn, Price Holman & Stern

[57] ABSTRACT

A piezoelectric hydrophone is designed with overload protectors (1*a*, 11*a*, 11*b*) which protects the hydrophone against internal and external overpressures. The hydrophone assembly proper and a first overload protector (1*a*) are made in one piece, while other overload protectors (11*a*, 11*b*) are mounted outside the hydrophone assembly (1) above the pressure sensitive diaphragms (4*a*, 4*b*).

The separate metallic parts of the hydrophone are joined by means of laser welding which may be performed in a pressure chamber. Likewise the final sealing of the hydrophone assembly may take place in a pressure chamber under a pressure corresponding to the water depth at which the hydrophone is operated.

6 Claims, 2 Drawing Sheets

PIEZOELECTRIC HYDROPHONE

Figure 1:
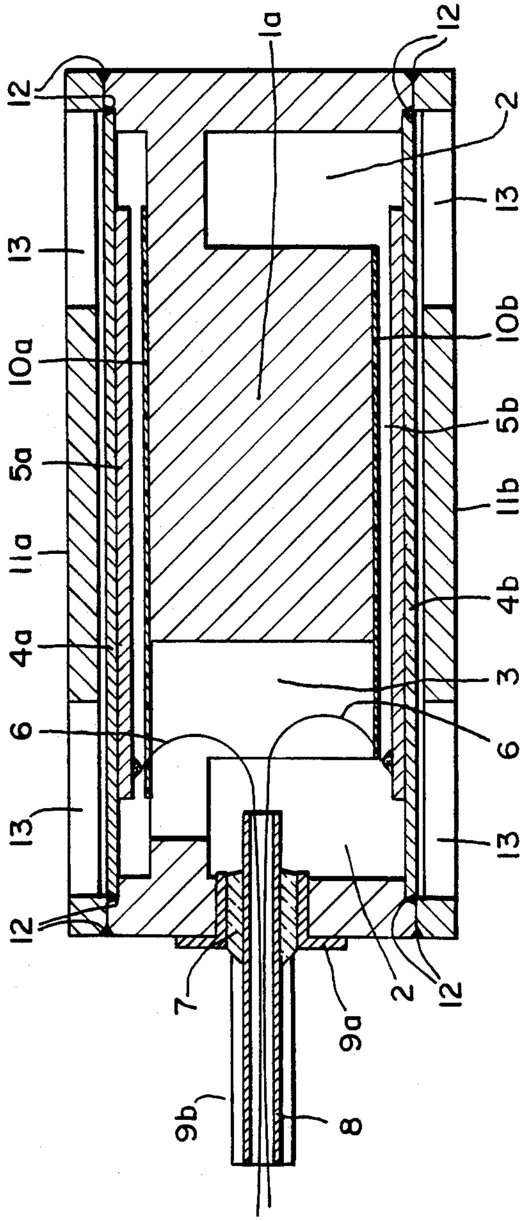

The present invention relates to a piezoelectric hydrophone and more particular a hydrophone assembly with overload protection, the hydrophone assembly and the overload protection being designed as an integral device.

Hydrophones with pressure sensitive diaphragms and piezoelectric units responding thereto are previously known and devices of this type has been disclosed e.g. by U.S. Pat. No. 3,255,431 and U.S. Pat. No. 3,970,878, as well as by Norwegian Patent Applications No. 843,743 to the present applicant. The first mentioned patent discloses the design of a hydrophone and an arrangement of the piezoelectric unit which essentially represent the general design presently being used in state of the art hydrophones. A disadvantage of this design is that the hydrophone does not offer a good protection of the piezoelectric unit against the ambient environment of the hydrophone, whether it is continued in a liquid filled streamer cable or is in direct contact with sea water. One of the great problems in connection with hydrophones is the conductor lead-in, which easily may become leaky, particularly when the hydrophone is exposed to pressure loads.

U.S. Pat. No. 3,970,878 discloses a different design of a hydrophone which in principle is based on the same design as the aforementioned patent, but with great importance attached to making the hydrophone assembly proper leakproof, in order that fluids may not enter coming into contact with the piezoelectric units. This patent discloses special measures taken regarding the protection of wire lead-in wires against leakage. The same patent also discloses the possibility of making the hydrophone proof against overpressure by specifying a plastic spacer which is inserted in the hydrophone assembly between the diaphragms to absorb external pressure loads and prevent a crushing deformation of the diaphragms and the piezoelectric units mounted thereupon.

An improved and simpler design of a hydrophone is disclosed by the Norwegian patent application 843,743. This design is generally based on commonly known state-of-art principles for the design of hydrophones and provides for the demand for operational reliability and miniaturization through its structural design. Further it is also designed in a way adapted to the development of the signal processing technology taking place in connection with marine seismic exploration. The hydrophones further disclose the use of an overload protection by pressure absorbing elements being mounted in the hydrophone assembly in order to protect the diaphragms against overpressure.

Concerning the general features of hydrophones intended for seismic exploration, there may generally be referred to the three above mentioned citations.

Yet prior art hydrophone designs have certain weaknesses in connection with such a use. Firstly the hydrophone assembly consists of several parts and although those parts which come into contact with the surrounding medium have been designed with corrosion-proof and sea water resistant materials, nevertheless the prior art methods for joining an assembly represent weak points in the construction. The welding and brazing methods applied hereto may for instance influence the materials in an disadvantageous way, causing the formation of thermal or corrosive stresses of the materials in the hydrophone assembly, something which after a long operational period may destroy the hydrophone. The production process may in addition make it difficult to produce hydrophones with an even, controllable quality.

The sealing of wire lead-in do not only depend on the materials used, but also on the methods being applied to the sealing, e.g. soldering or brazing which are burdened by the same problem as mentioned above. Eventually the order of the steps of the production process may be of importance for the quality of the finished hydrophone.

Further it is as mentioned known to protect the diaphragms and the piezoelectric units of the hydrophone against overpressure. This implies that they will not be damaged by deformation if the streamer cable e.g. for some reason or other reaches a greater depth of water than that which presently is the usual operational depth for streamer cables, i.e. maximum 50 to 100 m. However, the prior art overload protectors do not allow the operation of the hydrophones at greater depths as the diaphragms then will not be able to vibrate freely.

In future seismic exploration, especially at large ocean depths it would be desirable to operate in large water depths, even down to 1000 m. It is then a question of adapting the hydrophone to this environment e.g. by designing it in such a way that it may be possible to operate in a depth range from 200 to about 270 m. Depending on the structural design of the hydrophone it might then be provided hydrophones adapted to different water depths and corresponding streamer cables suitable for operations within the specified depth ranges.

The purposes of the present invention is thus to provide hyrophone which based on generally known principles regarding the operation and the design of the piezoelectric hydrophones is executed in such a manner that it has as simple construction and consists of the least possible number of parts and types of materials, being joined in such a way that the thereto applied processes do not diminish the quality of the hydrophone and its operational characteristics. Further the use of materials which are corrosion-proof and sea water resistant is desirable, likewise that the wire lead-ins are protected against leakage. It is also desirable that a hydrophone may be designed and produced under such conditions that it is protected against overload within a pressure range which in principle may vary from vacuum to about 100 bar, further that it by means of a specially adapted design procedure may be made to operate in defined depths ranges e.g. about 50 to 100 m etc. all the way down to a depth of about 1000 m. These purposes are attained with a hydrophone and a method of its production characterized by the features disclosed by the claims.

Figure 2:
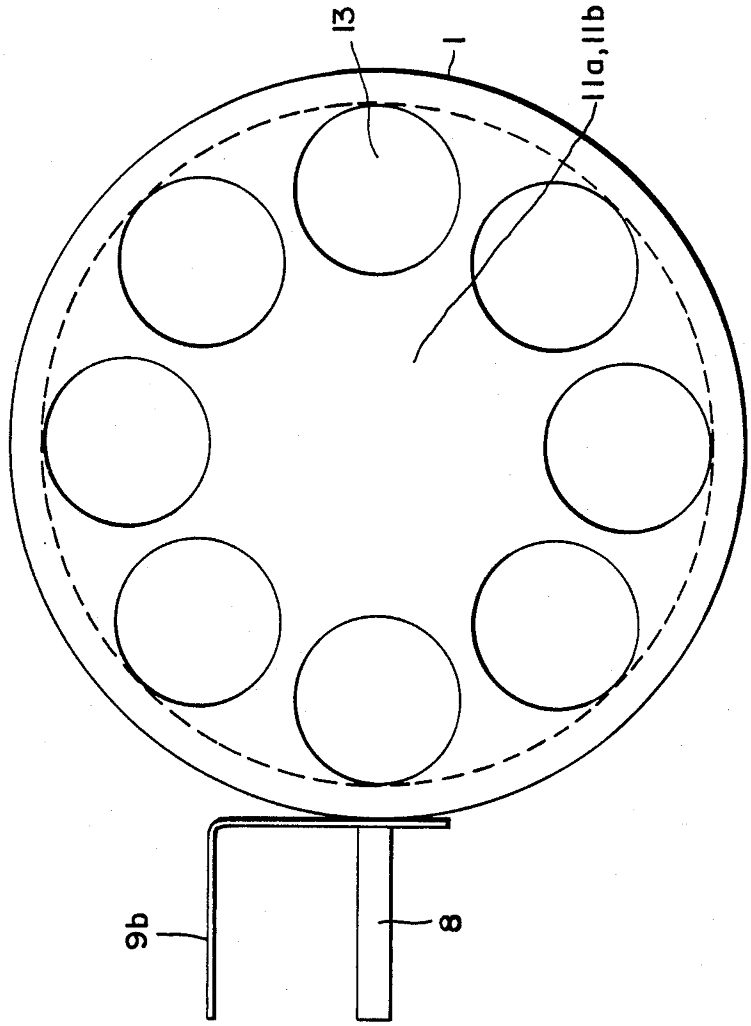

The invention will be described in greater detail below by means of an exemplary embodiment shown in the attached drawing, wherein FIG. 1 shows a radial section of a hydrophone in accordance with the present invention, and FIG. 2 shows a plan view of the hydrophones in FIG. 1.

The hydrophone according to the invention consists of a hydrophone assembly which in the drawing is designated 1. The hydrophone assembly which basically may have a disk-like form is during the production process formed such that the center section of the disk is recessed relative to the edge. In a preferred embodiment shown in FIG. 1 the original disk may for instance by sylindrical. Further a continuous part of the center section may be removed by milling or turning so as to form a continuous groove 2 at the edge of the disk in one side of the middle section. The weight of the hydrophone assembly 1 may thereby be reduced. The center section 1*a* is further provided with a through opening between the center of the disk, i.e. the hydrophone assembly, and the edge thereof. The edge of the hydrophone assembly is provided with a radially located opening which leads to the opening 3 in the center section 1*a*. The whole hydrophone assembly 1 and the center section 1*a* are designed as an integral piece. The materials used may preferably be a corrosion-proof and sea water resistant alloy, e.g. stainless steel or titanium alloys known in the art. The hydrophone assembly 1 is closed on each side of diaphragms designated 4*a*, 4*b*, whereto there by means of electrically conductive adhesive are mounted piezoelectric units, designated 5*a*, 5*b* respectively. The piezoelectric units 5*a*, 5*b* have attached elecrical leads or bonding wires 6 being lead in above said radially located opening or the lead-in aperture through a tube 8 located therein and fused in a glass body 7. The glass body 7 and the tube 8 are mounted in an annular bushing 9*a* which is joined by brazing to the hydrophone assembly in a well-known manner. The tube 8 may for instance be made of "Kovar". A soldering lug 9*b* may for instance be attached to the assembly 1, in order to facilitate the soldering of cables, for instance a grounding cable, to the hydrophone assembly. The soldering lug 9*b* may for instance be integral with the bushing 9*a*, but may also be a separate component and be a different design from the one shown here.

Between the center section 1*a* which constitutes a first overload protector and the diaphragms 4*a*, 4*b* there are respectively mounted isolating elements in the form of plastic film designated 10*a*, 10*b* respectively in order to prevent short circuit in case the diaphragms 4*a*, 4*b* and the respective piezoelectric elements 5*a*, 5*b* thereon are deformed due to an external over-pressure and thereby are brought in contact with the center element or the center section 1*a* which constitutes the first overload protection. At a distance outside the diaphragm 4*a*, 4*b* there are mounted second overload protectors 11*a*, 11*b* respectively in such a manner that they are at a certain distance from the diaphragm and affixed to the hydrophone assembly 1 at its edge. The second overload protectors 11*a*, 11*b* are in the form of perforated sheets in order to allow an almost unattenuated propagation of the acoustic pressure waves therethrough. The diaphragms 4*a*, 4*b* and the second overloaded protectors 11*a*, 11*b* are attached to the hydrophone assembly 1*a* by welding joints designated by reference number 12. A possible arrangement of the perforations 13 in the external overload protectors 11*a*, 11*b* is best seen in FIG. 2, wherein the perforations appear as a plurality of apertures located along the edge.

In the manufacture of the hydrophone according to the invention the separate components are joined by methods which are to be described in more detail hereinafter. As mentioned above an annular metal element or bushing 9*a* which carries the glass body or closure 7 and the conductor tube 8 are joined to the hydrophone assembly 1 by soldering. As the hydrophone assembly 1 is not yet sealed by the diaphragms 4*a*, 4*b*, occasional residues of soldering flux or solder generated during the soldering may easily be removed in order to avoid corrosion damage caused by such. The diaphragms 4*a*, 4*b* are then welded with the piezoelectric units 5*a*, 5*b* to the hydrophone assembly 1 by means of laser welding. During the laser welding the materials are fused together, as no filler or other weld metals are used to generate the weld joint. The use of other weld metals are used to generate the weld joint. The use of laser beams for welding makes possible the use of a welding pulse of short duration and high energy density at the weld such that the weld fuses with essentially no heat transfer to the surrounding material and the heat so generated in every sense are restricted to the weld proper. Thereby one avoids the propagation of heat by transfer to the hydrogen assembly, the diaphragms and the piezoelectric units, causing no damage due to thermal stresses or other thermal loads. In reality the welding spots immediately after the fusing of the parts may have a temperature which is not greater than that the weld zone may be touched. As no fillers are needed in laser welding, there is not produced residues of such with the possibility of corrosion damage of the welded parts. Also the second overload protectors 11*a*, 11*b* are welded to the hydrophone assembly 1 by means of laser welding. At this time the hydrophone assembly still are not sealed, as the tube 8 in the lead-in still are not closed, the eventual sealing is therefore now effected by the tube 8 being closed by fusing, for instance with tin.

By using laser welding it is advantageous that all welded parts are made of the same materials. One demand is then that the materials are weldable by laser. Several high grade alloys of this kind are known and preferable one may use stainless steel, titanium alloys and other laser weldable, high strength, corrosion-proof and sea water resistant alloys in both the hydrophone assembly 1, the diaphragms 4*a*, 4*b* and the second overload protectors 11*a*, 11*b*.

The laser welding may advantageously take place in a pressure chamber. The hydrophone and its separate components are then located in and manipulated inside a pressure chamber, while the laser beam for welding may be transmitted to the pressure chamber from the outside through a window located in the pressure chamber. The welding and the sealing may take place in the welding chamber in a controlled atmosphere and under pressure. If the final sealing of the hydrophone are performed, for instance by a laser undergiven pressure in a pressure chamber, the hydrophone then has the same internal pressure after the sealing. It is therefore in this way possible to manufacture a hydrophone with a internal overpressure allowing its application to greater water depths than hitherto has been the case. By controlling the pressure of the pressure chamber it is thus possible to manufacture hydrophones which may be operated in water depths down to about 1000 m as against a previous maximum of 50 to 100 m. The free path of movement of the diaphragms 4*a*, 4*b* between the overload protectors 1*a*, 11*a*, 1*b*, 11*b* determines the operating range of the hydrophone. By suitable overpressures and design of diaphragms and overload protectors one may have an operating range of depth within about 50 to 100 m all the way down from the sea surface and to a water depth of 1000 m.

It is seen that the first overload protector 1*a* protects the hydrophone against an external overpressure when the water depth is greater than the operating depth of the hydrophone, by preventing a destructive deformation of the diaphragms 4*a*, 4*b* and the piezoelectric units 5*a*, 5*b* attached thereto. Similarly the second overload protectors 11*a*, 11*b* protects the diaphragms and the piezoelectric units against destructive deformation because of the internal overpressure of the hydrophone assembly generated in the pressure chamber, at water depths less than the operating depth of the hydrophone. Naturally they also protect the hydrophone against the internal overpressure when handled outside the pressure chamber and at ordinarily atmospheric pressure.

The aperture 3 in the overload protector 1_a_ or the center section of the hydrophone assembly may, apart from the mounting of the bonding wired from the piezoelectric elements, also be employed for the mounting of microminiaturized electronic devices applied to amplifying or processing the detected signals.

It is thus to be understood that the above only is an embodiment by the way of example and that several modifications are possible within the scope and spirit of the invention.

We claim:

1. A piezoelectric hydrophone comprising:

a hydrophone assembly having side, front and rear edges and an integral center section recessed inwardly from said front and rear edges, the center section being provided with a first aperture therethrough, the hydrophone assembly being provided with a radially extending second aperture in said side edge communicating with said first aperture;

pressure sensitive front and rear diaphragms respectively closing the front and rear edges of the hydrophone assembly, the front and read diaphragms being integrally joined by laser welding to said hydrophone assembly at said front and rear edges thereof respectively, said front and rear diaphragms each having a piezoelectric element attached thereto;

a lead-in tube sealingly fused in said second aperture in said hydrophone assembly by a glass body, said lead-in tube carrying therethrough lead wires connected to the piezoelectric elements, the lead wires extending from the lead-in tube through said first aperture in said center section, the lead-in tube being sealed closed for sealing the interior of the hydrophone;

external overload protection means mounted respectively over each of said front and rear diaphragms at a distance therefrom for protecting said front and rear diaphragms and said piezoelectric elements from destructive deformation due to an internal overpressure condition, said external overload protector means allowing substantially unattenuated propagation of acoustic pressure waves therethrough; and a gas under pressure sealingly contained in said hydrophone for internally pressurizing the front and rear diaphragms;

and wherein the center section of said hydrophone assembly is integrally formed as one piece with the hydrophone assembly and serves as an internal overload protector means for protecting said front and rear diaphragms and said piezoelectric elements against destructive deformation due to an external overpressure condition.

2. The piezoelectric hydrophone according to claim 1, wherein said hydrophone assembly, said front and rear diaphragms and said external overload protector means are all formed of the same material.

3. The piezoelectric hydrophone according to claim 2 wherein said material is a corrosion-proof, sea water resistant and laser weldable metal selected from the group consisting of steel and titanium alloys.

4. The piezoelectric hydrophone according to claim 1, wherein the lead-in tube is of "Kovar".

5. The piezoelectric hydrophone according to claim 1, wherein the gas under pressure is selected from the group consisting of inert gases, nonreactive gases, and mixtures of gases.

6. A piezoelectric hydrophone according to claim 1, wherein said gas under pressure internally pressurizes the front and rear diaphragms to a pressure corresponding to the water pressure at an operating water depth of the hydrophone.

* * * * *